United States Patent
Weber et al.

(10) Patent No.: US 6,461,582 B2
(45) Date of Patent: Oct. 8, 2002

(54) SINGLE-CRYSTAL ROD AND PROCESS FOR ITS PRODUCTION

(75) Inventors: Martin Weber, Kastl (DE); Erich Gmeilbauer, St. Pantaleon (AT); Robert Vorbuchner, Burghausen; Alfred Miller, Emmerting, both of (DE)

(73) Assignee: Wacker Siltronic Gesellschaft fur Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/834,571

(22) Filed: Apr. 13, 2001

(65) Prior Publication Data

US 2002/0000188 A1 Jan. 3, 2002

(30) Foreign Application Priority Data

May 25, 2000 (DE) .......................................... 100 25 870

(51) Int. Cl.[7] .............................................. C01B 23/26
(52) U.S. Cl. ...................... 423/328.2; 117/13; 117/14; 252/62.3 V
(58) Field of Search ................ 117/13, 14; 252/62.3 V; 423/328.2

(56) References Cited

U.S. PATENT DOCUMENTS

| | | |
|---|---|---|
| 4,299,651 A | 11/1981 | Bonner |
| 4,586,979 A | 5/1986 | Katsumata et al. |
| 4,660,149 A | 4/1987 | Lissalde et al. |
| 6,030,450 A | 2/2000 | Saishouji et al. |

FOREIGN PATENT DOCUMENTS

| | | |
|---|---|---|
| EP | 0 142 415 | 5/1985 |
| EP | 0482438 | 4/1992 |

OTHER PUBLICATIONS

W. Zulehner and D. Huber, Czochralski–Grown Silicon, Crystals 8, Springer Verlag, 1982.

Patent Abstracts of Japan corresponding to JP 02018396.

Patent Abstracts of Japan corresponding to JP 59057987.

Patent Abstract of Japan corresponding to JP 04083790.

Translation of JP 09–208380.

Translation of JP 05–254978.

*Primary Examiner*—Felisa Hiteshew
(74) *Attorney, Agent, or Firm*—Collard & Roe, P.C.

(57) ABSTRACT

A single-crystal rod, obtained using CZ crucible pulling, has a crystal cone and a cylindrical single-crystal rod, and the crystal cone has an apex angle of 30° to 90°. There is also a process for producing dislocation-free single-crystal rods using CZ crucible pulling in which a seed crystal is immersed in a melt and is pulled out again, and a cone with an apex angle of from 30° to 90° is pulled.

5 Claims, 1 Drawing Sheet

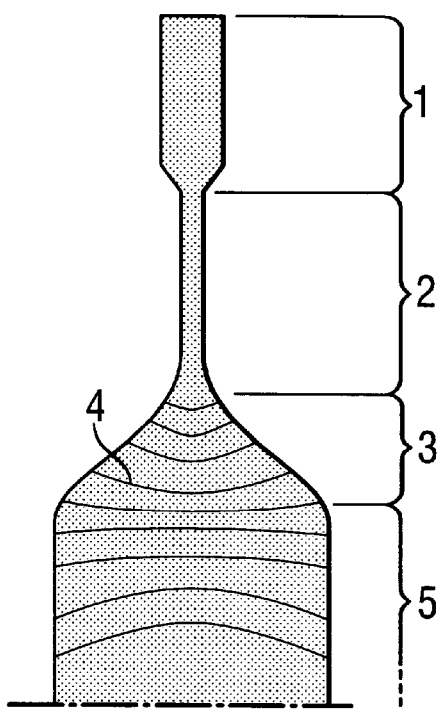
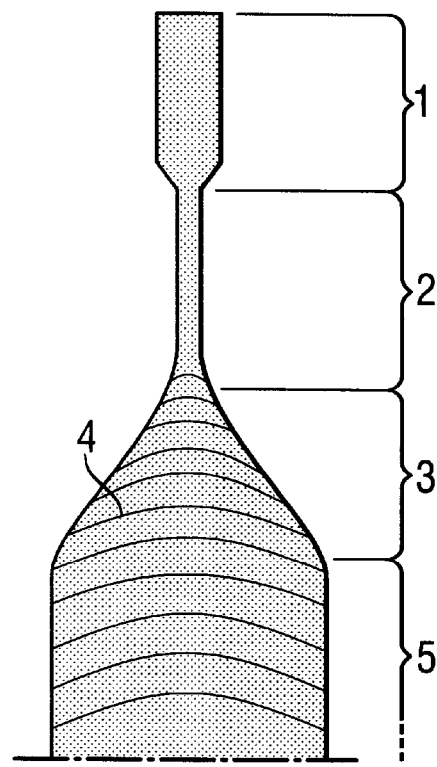
Fig. 1
Fig. 2

SINGLE-CRYSTAL ROD AND PROCESS FOR ITS PRODUCTION

BACKGROUND OF THE INVENTION

1. Field of the Invention

The present invention relates to a process for producing dislocation-free single-crystal rods using the CZ crucible pulling process, in which a seed crystal is immersed in a melt and is pulled out again.

2. The Prior Art

The Czochralski crucible pulling process (CZ crucible pulling process) and the float zone pulling process have become known for the production of highly pure single-crystal rods. In particular, these processes produce monocrystalline silicon rods. During the crucible pulling of crystal rods, in particular of semiconductor rods using the Czochralski method, the monocrystalline or polycrystalline semiconductor fragments which are provided for the production of the melt are generally added to a melting crucible. Then, by heating, the crucible temperature is increased until the contents of the crucible gradually pass into the molten state. Finally, a seed crystal is immersed in contact with the melt and generally, with the crucible and crystal rotating, a monocrystalline crystal rod is pulled from the melt.

This crystal rod is composed of the seed crystal, possibly the seed thin neck, a crystal cone (starting cone), which acts as a transition to the cylindrical crystal rod, and the crystal rod itself. The Czochralski crucible pulling process is extensively explained in, for example, W. Zulehner and D. Huber, Czochralski-Grown Silicon, Crystals 8, Springer Verlag, Berlin-Heidelberg, 1982, and the literature cited therein, taking particular account of what is currently the most important application area, namely the crucible pulling of silicon single crystals.

During the production of single-crystal rods, crystal dislocations frequently occur in the transition region from crystal cone, i.e. the starting cone, to the cylindrical rod part. These dislocations make this crystal rod unusable. These crystal dislocations occur in particular with doped silicon, especially with silicon which is doped with As or Sb. The rod which has been pulled has to be remelted and a renewed, complex attempt at pulling has to be started. However, the number of pulling attempts is limited, for example by the service life of the melting crucible, so that it is no longer possible to pull a defect-free single crystal.

SUMMARY OF THE INVENTION

Therefore, it is an object of the present invention to provide a defect-free single-crystal rod and a process for its production.

The above object is achieved according to the invention by a single-crystal rod, obtained using the CZ crucible pulling process, substantially comprising a crystal cone and a cylindrical rod part, wherein the crystal cone has an apex angle of 30° to 90°.

Surprisingly, it has been found that with certain starting cones crystal defects do not occur either in the cone region or in the cylindrical rod part. By way of example, As-doped and Sb-doped crystal rods with a (100) orientation can be obtained without defects with an acute-angled, long cone. If the cone of the crystal is pulled in a specific way (pointed cone), it is found that crystal dislocations no longer occur. The conditions required to achieve this are dependent, inter alia, on the diameter and orientation of the crystal. The crystal cone has an apex preferably from 40 to 60°.

The length and apex angle of the crystal cone are varied, for example, by rotating the melting crucible and/or the crystal, by increasing or decreasing the temperature of the melt and in particular by means of the crystal-lifting rate.

Consequently, the object is also achieved by a process for producing dislocation-free single-crystal rods using the CZ crucible pulling process, in which a seed crystal is immersed in a melt and is pulled out again, wherein a crystal cone with an apex angle of from 30 to 90° is pulled.

Surprisingly, it has been found that, in particular with high dopant quantities, for example, in the case of As-doped and Sb-doped melt material, specific pulling conditions are required for the starting-cone region of the crystal in order to obtain a defect-free crystal rod.

In a further embodiment of the process according to the invention, initially a thin neck and then a crystal cone with an apex angle of 30 to 90° is pulled.

The crystal growth, in particular the cone growth, is preferably set by the crystal-lifting rate and by the melting crucible rotation rate and/or the crystal rotation rate. The crystal-lifting rate is preferably from 0.5 to 2 mm/min and particularly preferably from 1 to 1.5 mm/min. The melting crucible rotation rate is preferably from 0 to 20 rpm and particularly preferably from 5 to 15 rpm; the crystal rotation rate is preferably from 10 to 30 rpm and particularly preferably from 15 to 20 rpm.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawings, wherein similar reference characters denote similar elements throughout the several views:

FIG. 1 shows a crystal rod according to the prior art; and

FIG. 2 shows a crystal rod according to the invention.

DETAILED DESCRIPTION OF PREFERRED EMBODIMENTS

FIG. 1 shows a crystal rod according to the prior art. Rod is obtained using the CZ crucible pulling process, having a seed crystal region 1, a thin neck region 2, a shallow, short crystal cone 3 and the cylindrical crystal rod 5, as well as the crystal growth front 4 connecting the cone 3 to the rod 5. A shallow cone of this nature has a concave growth front. At the transition to the cylindrical rod region, a change in the curvature of the crystal growth front 4 is observed (See FIG. 1). The change in the solidification front is to flat line which means that zero growth takes place in the interior of the crystal. It can be assumed that, as a result, accumulated silicon interstitial atoms occur, which in turn form small dislocation loops.

On the other hand, it is very much in the center of the crystal that the highest dopant concentrations occur, producing lattice stresses. Through interaction with the dislocation loops and the thermal stresses, with large crystal diameters, for example diameters of from 100 to 400 mm, dislocations may occur. These dislocations then propagate in the crystal, making it unusable. Eventually the crystal growth front becomes convex.

FIG. 2 shows a crystal rod according to the invention. Rod is obtained using the process according to the invention, having a seed crystal region 1, a thin neck region 2, a long, acute-angled crystal cone and the cylindrical crystal rod, connected together by the crystal growth front of the invention. The long, acute-angled crystal cone is distinguished by the fact that there is no change in the crystal growth front of the invention. Even in the cone, the solidification front has the same convex curvature as in the convex curvature of the cylindrical rod part (FIG. 2). Also in the crystal growth front, the solidification front has the same convex curvature as in the cylindrical rod part.

In addition to the freedom from dislocations, a further advantage of the crystal rod according to the invention is that the entire cylindrical region of the crystal rod can be used to produce semiconductor wafers, since the desired quality properties are established even at the beginning of the cylindrical rod part. The process according to the invention for the production of dislocation-free single-crystal rods is particularly suitable for highly doped crystals of (100) orientation. The crystal rod according to the invention does not have any crystal dislocations either in the region of the crystal cone or in the region of the cylindrical rod part.

To carry out the process for producing dislocation-free single-crystal rods, first of all a seed crystal 1 is immersed in a melt, preferably in a silicon melt, and is slowly pulled out with rotation. In one embodiment, initially a thin neck 2 is pulled, in order to avoid dislocations. This is followed by the conical transition to the cylindrical rod part. The semiconductor wafers are obtained from the rod part. Particularly in the case of highly doped crystals, dislocations which make the crystal unusable occur in the crystal cone and in the transition region to the cylindrical rod part. In this case, that part of the single crystal which has already been pulled is remelted and a further attempt at pulling with temperature stabilization and immersion of the seed crystal is commenced. The renewed attempts at pulling require considerable time. In this case, inter alia, the quartz glass crucible is stressed so greatly that quartz particles become detached, which in turn initiate crystal dislocations. Therefore, with each attempt at pulling, the likelihood of pulling a usable silicon rod falls. If an acute-angled, long crystal cone is pulled instead of the conventional shallow, short crystal cone 3, dislocations do not occur either in the cone region or in the cylindrical rod region.

The crystal cone of the invention has an apex angle of 30° to 90°, preferably from 30° to less than 90°, and most preferably from 40° to 60°, as shown in FIG. 2. FIG. 1 shows an apex angle for the prior art cone 3 which is greater than 90°.

The following Examples are merely illustrative of the present invention, without being deemed limitative in any manner thereof.

EXAMPLES

In the examples below, crystal rods with pointed cones with apex angles of less than 90° were pulled for the invention. A crystal lifting rate of >1 mm/min, crystal rotations of less than 15 rpm, crucible rotations of less than 20 rpm and an adapted heater power were used. The resistivity of the arsenic-doped or antimony-doped, (100)-oriented crystals was less than 5 mOhmcm or below 25 mOhmcm, respectively. See Table 1 below.

TABLE 1

| Crystal diameter | Doping | Mean number of attempts at pulling with standard cone | Mean number of attempts at pulling with pointed cone |
|---|---|---|---|
| 5" | As | 2.5 | 1.5 |
| 6" | As | 3.0 | 2.0 |
| 8" | As | 4.5 | 2.5 |
| 5" | Sb | 3.0 | 2.0 |
| 6" | Sb | 4.0 | 2.5 |
| 8" | Sb | 4.5 | 2.5 |

The reduction in the number of attempts at pulling is represented in the following Table 2 based on the example of a low-resistance arsenic process, using a statistical evaluation. The overall time required for the attempts at pulling is indicated in this figure as the lead time (AZ). The statistical assessment reveals a significant reduction in the lead time as a result of using pointed cones.

TABLE 2

|  | Standard cone | Pointed cone |
|---|---|---|
| Number of attempts | 18 | 14 |
| Mean lead time | 991 min | 593 min |
| Median | 1093 min | 425 min |
| Maximum | 1595 min | 1480 min |
| Minimum | 285 min | 215 min |
| Standard deviation | 376 min | 411 mim |

Accordingly, while a few embodiments of the present invention have been shown and described, it is to be understood that many changes and modifications may be made thereunto without departing from the spirit and scope of the invention as defined in the appended claims.

What is claimed is:

1. A single-crystal rod obtained using the CZ crucible pulling process, comprising a crystal cone; and a cylindrical single-crystal rod; and wherein the crystal cone has an apex angle of 30° to 90°.

2. The single-crystal rod as claimed in claim 1, wherein the crystal rod has a doping.

3. The single-crystal rod as claimed in claim 1, wherein the crystal growth front (4) has the same convex curvature in said cone (3) and said rod (5).

4. A process for producing dislocation-free single-crystal rods using the CZ crucible pulling process, comprising immersing a seed crystal in a melt and pulling the seed crystal out again;

so as to pull a crystal rod having a cone with an apex angle of from 30° to 90°.

5. The process as claimed in claim 4, wherein the apex angle of the crystal cone is determined by a step selected from the group consisting of rotating of the melt crucible, rotating of the crystal, increasing or decreasing temperature of the melt, crystal-lifting rate, and combinations thereof.

* * * * *